US011575855B2

(12) United States Patent
Livoti et al.

(10) Patent No.: US 11,575,855 B2
(45) Date of Patent: *Feb. 7, 2023

(54) METHODS AND APPARATUS TO PERFORM AN AUTOMATED GAIN CONTROL PROTOCOL WITH AN AMPLIFIER BASED ON HISTORICAL DATA CORRESPONDING TO CONTEXTUAL DATA

(71) Applicant: The Nielsen Company (US), LLC, New York, NY (US)

(72) Inventors: John T. Livoti, Clearwater, FL (US); Susan Cimino, Odessa, FL (US); Rajakumar Madhanganesh, Tampa, FL (US); Stanley Wellington Woodruff, Palm Harbor, FL (US)

(73) Assignee: The Nielsen Company (US), LLC, New York, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 17/329,076

(22) Filed: May 24, 2021

(65) Prior Publication Data
US 2021/0281796 A1   Sep. 9, 2021

Related U.S. Application Data

(63) Continuation of application No. 16/452,485, filed on Jun. 25, 2019, now Pat. No. 11,019,301.

(51) Int. Cl.
*H04W 48/16* (2009.01)
*H04N 5/52* (2006.01)
(Continued)

(52) U.S. Cl.
CPC ............ *H04N 5/52* (2013.01); *H03G 3/3052* (2013.01); *H04L 65/60* (2013.01); *H04B 1/123* (2013.01); *H04W 48/16* (2013.01)

(58) Field of Classification Search
CPC . H04W 48/16; H04W 52/0254; H04W 52/02; H04W 88/02; H04W 52/52;
(Continued)

(56) References Cited

U.S. PATENT DOCUMENTS 5,983,183 A   11/1999   Tabet et al.
6,191,725 B1   2/2001   Lavoie
(Continued)

FOREIGN PATENT DOCUMENTS

EP            0633658       1/1995
WO          2020263657      12/2020

OTHER PUBLICATIONS

Prabhavalkar, Rohit et al., "Automatic Gain Control and Multi-Style Training for Robust Small-Footprint Keyword Spotting With Deep Neural Networks", Apr. 19-24, 2015, 7 pages.
(Continued)

*Primary Examiner* — Eva Y Puente
(74) *Attorney, Agent, or Firm* — Hanley, Flight & Zimmerman, LLC

(57) ABSTRACT

Methods and apparatus to perform an automated gain control protocol with an amplifier based on historical data corresponding to contextual data are disclosed. Example apparatus disclosed herein are to select an automatic gain control (AGC) parameter for an AGC protocol based on historical data corresponding to contextual data, the contextual data including at least one of a time during which the AGC protocol is performed, a panelist identified by a meter, demographics of an audience identified by the meter, a location of the meter, a station identified by the meter, a media type identified by the meter, or a sound pressure level identified by the meter. The disclosed example apparatus are also to perform the AGC protocol based on the selected AGC parameter.

27 Claims, 5 Drawing Sheets

(51) Int. Cl.
*H03G 3/30* (2006.01)
*H04L 65/60* (2022.01)
*H04B 1/12* (2006.01)

(58) Field of Classification Search
CPC ..... H04W 36/06; H04W 36/30; H04W 74/04; H04W 88/08; H04B 1/7085; H04B 1/7117; H04B 1/707; H04B 1/109; H04B 1/123; H04B 17/327; H04B 7/18523; H04B 1/16; H04B 10/2942; H03G 3/3052; H03G 3/3078; H03G 3/3005; H03G 3/3089; H03G 1/00; H03G 3/001; H03G 3/30; H03G 3/3068; H03G 9/005
USPC ......................................................... 375/345
See application file for complete search history.

(56) References Cited

U.S. PATENT DOCUMENTS

| | | | |
|---|---|---|---|
| 7,245,638 B2 | 7/2007 | Agazzi et al. | |
| 8,392,180 B1 | 3/2013 | Lachapelle et al. | |
| 8,538,749 B2 | 9/2013 | Visser et al. | |
| 9,065,525 B1* | 6/2015 | Yosoku | H04B 1/123 |
| 9,332,305 B1 | 5/2016 | Lee | |
| 10,277,183 B2 | 4/2019 | Cohrs | |
| 10,359,776 B2 | 7/2019 | Chen | |
| 10,867,617 B1* | 12/2020 | Nakagawa | G10L 21/0224 |
| 11,019,301 B2* | 5/2021 | Livoti | H04N 5/52 |
| 2005/0047534 A1 | 3/2005 | Lindoff et al. | |
| 2006/0210096 A1 | 9/2006 | Stokes, III et al. | |
| 2008/0148307 A1 | 6/2008 | Nielsen et al. | |
| 2009/0220109 A1 | 9/2009 | Crockett et al. | |
| 2011/0243038 A1 | 10/2011 | Challa et al. | |
| 2011/0275412 A1 | 11/2011 | Khawand | |
| 2013/0243227 A1 | 9/2013 | Kinsbergen et al. | |
| 2014/0144233 A1* | 5/2014 | Kim | G01C 19/5776 73/504.12 |
| 2015/0268637 A1* | 9/2015 | Miyahara | G04R 20/10 368/47 |
| 2016/0049915 A1 | 2/2016 | Wang et al. | |
| 2016/0173808 A1 | 6/2016 | Reams | |
| 2016/0308564 A1 | 10/2016 | Alriksson et al. | |
| 2017/0155369 A1 | 6/2017 | Wang et al. | |
| 2018/0287837 A1* | 10/2018 | Zhang | H04L 27/01 |
| 2022/0030527 A1 | 1/2022 | Kim et al. | |

OTHER PUBLICATIONS

Lyon, Richard F., "Machine Hearing: An Emerging Field", IEEE Signal Processing Magazine, Sep. 2010, pp. 131-139, 6 pages.
International Searching Authority, "Search Report and Written Opinion," issued in connection with International Application No. PCT/US2020/038196, dated Sep. 25, 2020, 10 pages.
International Searching Authority," International Preliminary Report on Patentability," issued in connection with International Application No. PCT/US2020/038196, dated Dec. 28, 2021, 6 pages.
United States Patent and Trademark Office, "Non-Final Office Action," issued in connection with U.S. Appl. No. 16/452,485, dated Dec. 19, 2019, 7 pages.
United States Patent and Trademark Office, "Final Office Action," issued in connection with U.S. Appl. No. 16/452,485, dated May 28, 2020, 5 pages.
United States Patent and Trademark Office, "Notice of Allowance and Fee(s) Due," issued in connection with U.S. Appl. No. 16/452,485, dated Oct. 15, 2020, 9 pages.
United States Patent and Trademark Office, "Notice of Allowance and Fee(s) Due," issued in connection with U.S. Appl. No. 16/452,485, dated Feb. 3, 2021, 9 pages.
United States Patent and Trademark Office, "Non-Final Office Action," issued in connection with U.S. Appl. No. 17/561,522, dated Sep. 30, 2022, 8 pages.

* cited by examiner

METHODS AND APPARATUS TO PERFORM AN AUTOMATED GAIN CONTROL PROTOCOL WITH AN AMPLIFIER BASED ON HISTORICAL DATA CORRESPONDING TO CONTEXTUAL DATA

RELATED APPLICATION

This patent arises from a continuation of U.S. patent application Ser. No. 16/452,485, entitled "METHODS AND APPARATUS TO PERFORM AN AUTOMATED GAIN CONTROL PROTOCOL WITH AN AMPLIFIER BASED ON HISTORICAL DATA CORRESPONDING TO CONTEXTUAL DATA," and filed on Jun. 25, 2019. Priority to U.S. patent application Ser. No. 16/452,485 is claimed. U.S. patent application Ser. No. 16/452,485 is incorporated herein by reference in its entirety.

FIELD OF THE DISCLOSURE

This disclosure relates generally to audio signal recovery and, more particularly, to methods and apparatus to perform an automated gain control protocol with an amplifier based on historical data corresponding to contextual data.

BACKGROUND

Media monitoring meters are used in homes and other locations to determine exposure to media (e.g., audio media and/or video media) output by media output devices. Such media output devices include televisions, radios, computers, tablets, and/or any other device capable of outputting media. In some examples, an audio component of the media is encoded with a watermark (e.g., a code) that includes data related to the media. In such examples, when the meter receives the media, the meter extracts the watermark to identify the media. Additionally, the meter transmits the extracted watermark to an audience measurement entity to monitor media exposure. In some examples, the meter generates a signature or fingerprint of the media based on the characteristics of the audio component of the media. In such examples, the meter transmits the signature to the audience measurement entity. The audience measurement entity compares the generated signature to stored reference signatures in a database to identify a match, thereby identifying the media. The audience measurement entity monitors media exposure based on a match between the generated signature and a reference signature.

BRIEF DESCRIPTION OF THE DRAWINGS

The figures are not to scale. Wherever possible, the same reference numbers will be used throughout the drawing(s) and accompanying written description to refer to the same or like parts.

Figure 1:
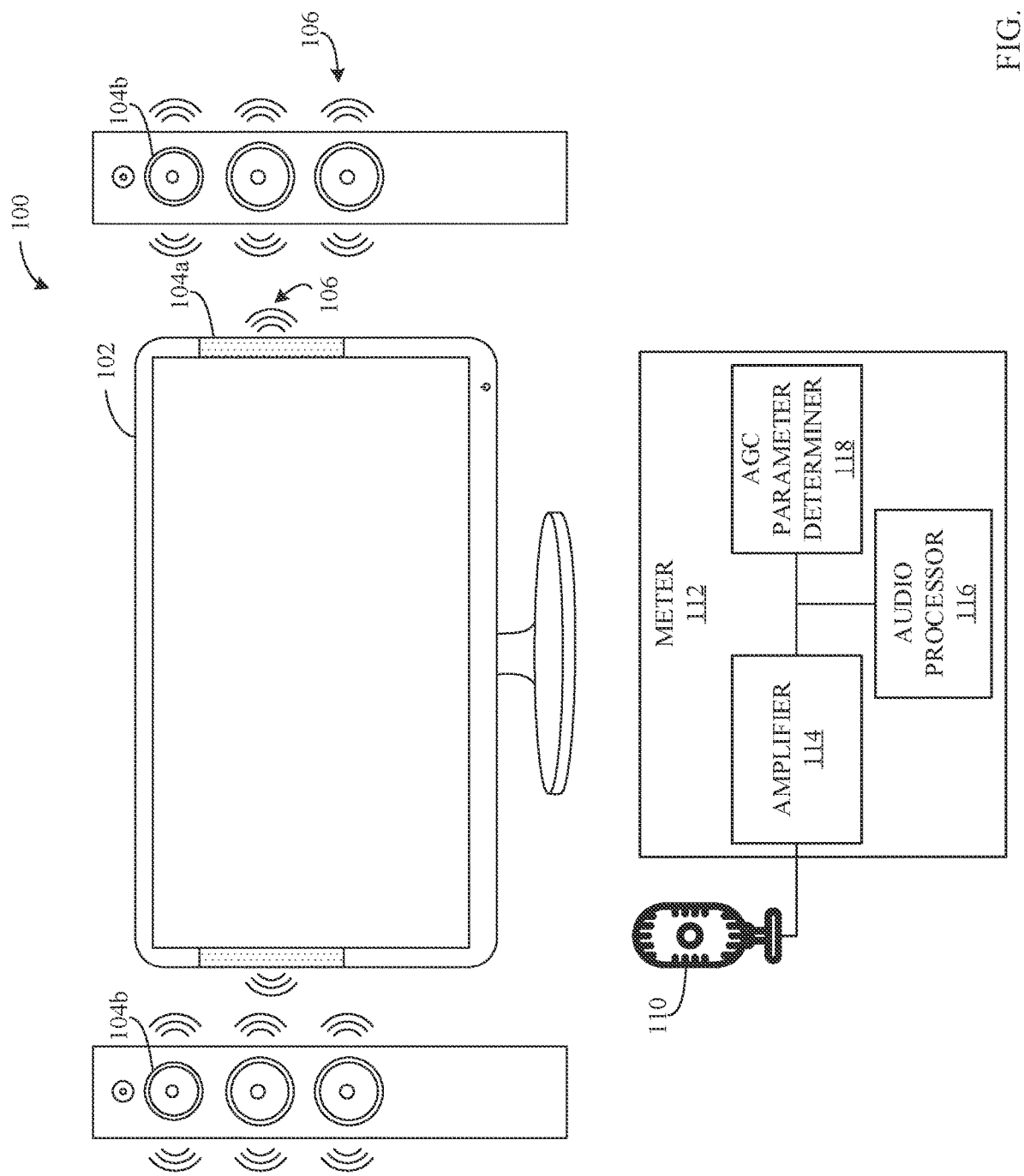
FIG. 1 is an illustration of an example environment for selecting AGC parameters of an AGC protocol based on historic data in accordance with teachings of this disclosure.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

When a panelist signs up to have their exposure to media monitored by an audience measurement entity, the audience measurement entity sends a technician to the home of the panelist to install a meter (e.g., a media monitor) capable of gathering media exposure data from a media output device (s) (e.g., a television, a radio, a computer, etc.). Generally, the meter includes or is otherwise connected to a microphone and/or a magnetic-coupling device to gather ambient audio. In this manner, when the media output device is "on," the microphone may receive an acoustic signal transmitted by the media output device. As further described below, the meter may extract audio watermarks from the acoustic signal to identify the media. Additionally or alternatively, the meter may generate signatures and/or fingerprints based on the media. The meter transmits data related to the watermarks and/or signatures to the audience measurement entity to monitor media exposure. Examples disclosed herein relate to efficiently selecting a desirable gain to amply a received signal at a meter prior to processing the audio.

Audio watermarking is a technique used to identify media such as television broadcasts, radio broadcasts, advertisements (television and/or radio), downloaded media, streaming media, prepackaged media, etc. Existing audio watermarking techniques identify media by embedding one or more audio codes (e.g., one or more watermarks), such as media identifying information (e.g., herein information and/or data) and/or an identifier that may be mapped to media identifying information, into an audio and/or video component. In some examples, the audio or video component is selected to have a signal characteristic sufficient to mask the watermark. As used herein, the terms "code" or "watermark" are used interchangeably and are defined to mean any identification information (e.g., an identifier) that may be inserted or embedded in the audio or video of media (e.g., a program or advertisement) for the purpose of identifying the media or for another purpose such as tuning (e.g., a packet identifying header). As used herein "media" refers to audio and/or visual (still or moving) content and/or advertisements. To identify watermarked media, the watermark(s) are extracted and used to access a table of reference watermarks that are mapped to media identifying information.

Unlike media monitoring techniques based on codes and/or watermarks included with and/or embedded in the monitored media, signature or fingerprint-based media monitoring techniques generally use one or more inherent characteristics of the monitored media during a monitoring time interval to generate a substantially unique proxy for the media. Such a proxy is referred to as a signature or fingerprint, and can take any form (e.g., a series of digital values, a waveform, etc.) representative of any aspect(s) of the media signal(s) (e.g., the audio and/or video signals forming the media presentation being monitored). A signature may be a series of signatures collected in series over a time interval. A good signature is repeatable when processing the same media presentation, but is unique relative to other (e.g., different) presentations of other (e.g., different) media. Accordingly, the term "signature" and "fingerprint" are used interchangeably herein and are defined herein to mean a proxy for identifying media that is generated from one or more inherent characteristics of the media.

Signature-based media monitoring generally involves determining (e.g., generating and/or collecting) signature(s) representative of a media signal (e.g., an audio signal and/or a video signal) output by a monitored media device and comparing the monitored signature(s) to one or more references signatures corresponding to known (e.g., reference) media sources. Various comparison criteria, such as a cross-correlation value, a Hamming distance, etc., can be evaluated to determine whether a monitored signature matches a particular reference signature. When a match between the monitored signature and one of the reference signatures is found, the monitored media can be identified as corresponding to the particular reference media represented by the reference signature that matched the monitored signature. Because attributes, such as an identifier of the media, a presentation time, a broadcast channel, etc., are collected for the reference signature, these attributes may then be associated with the monitored media whose monitored signature matched the reference signature. Example systems for identifying media based on codes and/or signatures are long known and were first disclosed in Thomas, U.S. Pat. No. 5,481,294, which is hereby incorporated by reference in its entirety.

When a meter senses audio via a sensor (e.g., microphone), the meter uses an amplifier to amplify the sensed audio signal prior to processing the audio signal to generate signatures and/or extract watermarks. The amount of gain (e.g., amplification, which may be greater than 1, less than 1 or equal to 1) used by the amplifier corresponds to the accuracy of signature generation and/or watermark extraction. For example, when the volume of audio output by an media presentation device is low, the gain should be a high gain to successfully generate a signature and/or extract a watermark. However, when the volume of the audio output by the media presentation device is high, applying a high gain will result in undesired clipping of the audio, leading to inaccurate signatures and/or watermark extraction failures.

Automated gain control (AGC) protocols can be implemented to automatically determine a satisfactory (e.g., optimal) gain level to utilize in the amplifier of a meter that allows the meter to successfully generate signatures and/or extract watermarks without clipping the audio signal. An AGC protocol adjusts the gain within a range of gain levels to attempt to select the highest gain that does not clip the signal. For example, an AGC protocol may ramp down from the highest gain of the range to a gain at which clipping ceases. Once the meter determines that clipping has ceased, the meter utilizes the gain (e.g., locks the gain) at which clipping ceases for processing audio until the AGC protocol is rerun (e.g., after a duration of time, after a triggering event, etc.).

Traditional AGC protocols test the same range of gains each time the protocol is triggered. For example, if the AGC protocol starts at the highest gain (100 decibels (dB)) of an amplifier and ramps down to the lowest gain (e.g., 5 dB) of an amplifier, every time the AGC protocol is run the amplifier will start at the highest gain. Accordingly, if a user is watching a television show at a high volume and the AGC protocol is triggered every two minutes, the gain selected by the AGC protocol will be a low gain (e.g., 10 dB). Although it is likely that the volume of the television show will not decrease significantly within two minutes, when a subsequent AGC protocol is performed, the protocol will start at 100 dB, even though clipping will likely occur until the gain is reduced to the 10 dB level, thereby requiring additional time and processor resources. Examples disclosed herein utilize past AGC selected gains to adjust the AGC protocol for subsequent AGC measurements to conserve time and/or processor resources. Using the example from above, if the first AGC protocol resulted in a selected gain of 10 dB, a subsequent AGC protocol may start at 20 dB instead of 100 dB. In this manner, the subsequent AGC protocol will select an appropriate gain fast than traditional techniques which causes less processor resources to be consumed for the subsequent AGC protocol.

Additionally or alternatively, examples disclosed herein may utilize various available data to adjust AGC protocol parameters, such as the range of gains and/or starting gain of an AGC protocol. For example, if the meter has identified a panelist, examples disclosed herein may track the listening habits of the panelist and select AGC parameters based on the panelists habits. The panelist may historically listen to audio at very high volumes corresponding to low selected gains from previous protocols. For example, the resulting gains from previous AGC protocols for a particular panelist may range from 20 dB to 5 dB. In such an example, when a AGC protocol is about to be performed, examples disclosed herein utilize the history of the panelist to reduce the starting gain and/or range of gains to be used for the AGC protocol based on the history and perform the AGC protocol based on the selected starting gain and/or range of gains. Using the above example, instead of performing an AGC protocol by ramping a gain down from 100 dB to 0 dB, examples disclosed herein determine that the panelist is being exposed to the media and may start the AGC protocol at 25 dB (e.g., the highest recorded gain for the panelist with a buffer) and ramp down to 0 dB based on the AGC result history corresponding to the panelist. Additionally or alternatively, examples disclosed herein may adjust the starting gain and/or range of gains used in an AGC based on time of day/week/month/year, type of media (e.g., sports, movies, sitcoms, etc.), channels, channel favorites, sound pressure level, location of meter (e.g., in bedroom, family room, kitchen, bar, etc.), etc.

FIG. 1 illustrates an example environment 100 for selecting AGC parameters for an AGC protocol based on historic data in accordance with teachings of this disclosure. The example environment 100 of FIG. 1 includes an example media output device 102, example speakers 104a, 104b, an example audio signal 106, an example microphone 110, and an example meter 112. The example meter 112 includes an example amplifier 114, an example audio processor 116, and an example AGC parameter determiner 118.

The example media output device 102 of FIG. 1 is a device that outputs media. Although the example media output device 102 of FIG. 1 is illustrated as a television, the example media output device may be a radio, an MP3 player, a video game counsel, a stereo system, a mobile device, a computing device, a tablet, a laptop, a projector, a DVD player, a set-top-box, an over-the-top device, and/or any device capable of outputting media. The example media output device may include speakers 104a and/or may be coupled, or otherwise connected to portable speakers 104b via a wired or wireless connection. The example speakers 104a, 104b output the audio portion of the media output by the example media output device.

The example microphone 110 of FIG. 1 is an audio sensor that receives the example audio signal 106 (e.g., as part of a sensing of ambient sound). The microphone 110 converts the example audio signal 106 into an electrical signal representative of the audio signal. The example microphone 110 transmits the electrical signal to the example amplifier 114 of the example meter 112. The example amplifier 114 amplifies the electrical signal so that the meter 112 can generate signatures and/or extract watermarks based on the amplified electrical signal, as further described below.

The example meter 112 of FIG. 1 is a device installed in a location of a panelist that monitors exposure to media from the example media output device 102. Panelists are users included in panels maintained by a ratings entity (e.g., an audience measurement company) that owns and/or operates the ratings entity subsystem. The example meter 112 may extract watermarks and/or generate signatures from media output by the example media output device 102 to identify the media. The example meter 112 is coupled or otherwise connected to the example microphone 110. As described above, the example microphone 110 is a device that receives ambient audio. In some examples, the microphone 110 may be magnetic-coupling device (e.g., an induction coupling device, a loop coupling receiver, a telecoil receiver, etc.), and/or any device capable of receiving an audio signal. In such examples, the magnetic-coupling device may receive an audio signal (e.g., the example audio signal 106) wirelessly rather than acoustically. The example microphone 110 and the example meter 112 may be connected via a wired or wireless connection. In some examples, the example microphone 110 and the example meter 112 may be one device. For example, the example microphone 110 may be embedded in the example meter 112. The example meter 112 includes the example amplifier 114, the example AGC parameter determiner 118 and the example audio processor 116.

The example amplifier 114 of FIG. 1 obtains the electrical signal representative of the example audio 106 from the example microphone 110. The example amplifier 114 amplifies power and/or amplitude the electrical signal using a gain level. The example audio processor 116 can adjust the gain level from any value between a maximum gain of the amplifier 114 to a minimum gain of the amplifier 114. The maximum gain and minimum gain of the amplifier 114 depend on the hardware characteristics of the amplifier 114.

The example audio processor 116 of FIG. 1 processes audio based on the amplified electrical signal. As described above, if the electrical signal is amplified too much, clipping can occur which reduces the effectiveness of signature generation and/or watermark extraction. However, if the electrical signal is amplified too little, the electrical signal is not powerful enough for the audio processor 116 to generate a signature and/or extract a watermark. Accordingly, the example audio processor 116 perform an AGC protocol to adjust the gain of the amplifier 114 to attempt to select the highest, or a sufficiently high, gain for the amplifier 114 that does not result in clipping. The AGC protocol may include starting the amplifier 114 at a starting gain level where clipping is occurring, decreasing the gain until the clipping ceases. In some examples, the audio processor 116 may perform other types of AGC protocols. For example, the audio processor 116 may start at a gain level where clipping doesn't occur, and increase the gain until clipping occurs to determine the highest, or a high, gain level before clipping begins to occur. The example audio processor 116 adjusts the gains during the AGC protocol based on the AGC parameters generated by the example AGC parameter determiner 118. The AGC parameters may correspond to the starting gain level to use during the AGC protocol and/or the range of gain levels to use during the ramping of the AGC protocol.

The example AGC parameter determiner 118 of FIG. 1 generates the AGC parameters based on historical data corresponding to time of day/week/month/year, previous AGC protocol results, media type, channel, station, favorites, panelist data, sound pressure level, location of the meter, etc. Additionally or alternatively, the example AGC parameter determiner 118 may determine parameters for different types of protocols, such as sound pressure algorithms. Initially, the AGC parameter determiner 118 may utilize standard AGC parameters (e.g., an initial gain level and/or gain range for an AGC protocol). However, as the example audio processor 116 performs AGC protocols, the example AGC parameter determiner 118 stores the results (e.g., the selected gain level resulting from an AGC protocol) and/or other contextual data in conjunction with the results to build a database of historical data that can be used to select AGC parameters for subsequent AGC protocols. For example, if the audio processor 116 performs an AGC protocol resulting in a gain level of 50 dB, the AGC parameter determiner 118 stores the selected 50 dB gain level in conjunction with at least one of the day/week/month/year, panelist information, demographic information, media type information, channel information, station information, sound pressure level, location of meter, etc. As additional AGC protocols are performed, the database of historical information is developed, resulting in more accurate AGC parameters for subsequent AGC protocols. As used herein, historical data is defined as result(s) of one or more previously performed protocol (e.g., previously selected gain levels). For example, when a gain is selected from an AGC protocol, the gain is stored in one or more locations the database as historical data. As used herein, contextual information is defined as any contextual information corresponding to an AGC protocol. For example, when an AGC protocol is performed, the location of the meter, panelists logged into the meter, demographics of audience members, the time of day/week/month/year, the sound pressure information, etc. may be contextual information corresponding to the AGC protocol. When an AGC protocol is performed, the resulting gain level selected by the protocol is stored in the database in conjunction with contextual information known when the AGC protocol is performed. Accordingly, the historical data is stored in the database in conjunction with historical (e.g., prior) contextual information.

When a AGC protocol is about to be performed (e.g., periodically, aperiodically, and/or based on a trigger), the example AGC parameter determiner 118 of FIG. 1 determines if any contextual information (e.g., time of day/week/month/year, channel, station, panelist information, demographic, etc.) is known at that moment. For example, the audio processor 116 and/or another component of the meter 112 may transmit contextual information to the example AGC parameter determiner 118. If contextual information is known, the example AGC parameter determiner 118 uses historic data corresponding to the known contextual information to determine the AGC parameters (e.g., based on a weighted average, a worst case scenario analysis, and/or any other statistical analysis). For example, if an AGC protocol is about to be performed and the example AGC parameter determiner 118 determines that a known panelist is watching sports in the evening, the AGC parameter determiner 118 determines the previous results (e.g., selected gain levels) corresponding to any one and/or combination of the last selected gain level, the panelist, sports, and/or evening. In such an example, the AGC parameter determiner 118 determines that previous selected gain levels for the panelist range from 25-30 dB, previous selected gains for sports range from 50-10 dB, previous selected gains for evening range from 50-15 dB, the previous selected gain levels for the panelist when watching sports corresponds to 30-27 dB, and the previous selected gain level for the meter was 25 dB, the AGC parameter determiner 118 may select the starting gain level and/or gain level range based on any one or combination of the panelist gain range, the sports gain range, the evening gain range, the panelist and sports gain range, and/or the previous gain. For example, the AGC parameter determiner 118 may perform a weighted average, a statistical distribution, and/or a worse case analysis to select a starting gain level and/or gain range for the upcoming AGC protocol. In some examples, the example AGC parameter determiner 118 is located outside of the meter 112 (e.g., at a server, in the cloud, etc.) and communicates with the meter 112 via a network communication. The example AGC parameter determiner 118 is further described below in conjunction with FIG. 2.

Figure 2:
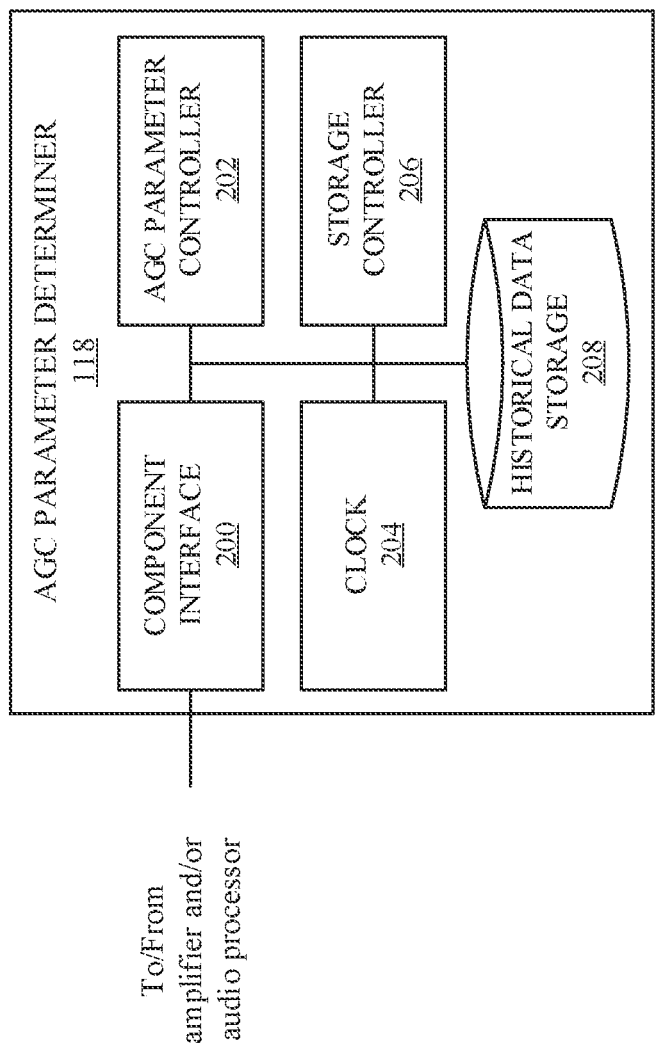
FIG. 2 is a block diagram of the example AGC parameter determiner of FIG. 1.

FIG. 2 is a block diagram of an example implementation of the example AGC parameter determiner 118 of FIG. 1, which is to generate historical data corresponding to AGC protocols and use the historical data to generate AGC parameters for subsequent AGC protocols. While the example AGC parameter determiner 118 is described in conjunction with the example meter 112 and media output device 102 of FIG. 1, the example AGC parameter determiner 118 may be utilized to in conjunction with any type of meter and/or media output device. The example AGC parameter determiner 118 of FIG. 2 includes an example component interface 200, an example AGC parameter controller 202, an example clock 204, an example storage controller 206, and an example historical data storage 208.

The example component interface 200 of FIG. 2 interfaces with the example audio processor 116 and/or any other component of the example meter 112. For example, the component interface 200 receives instructions from the example audio processor 116 to generate AGC parameters for an upcoming AGC protocol. In some examples, the example component interface 200 may receive contextual data (e.g., time data, panelist data, demographic data, channel data, station data, sound pressure level, location data, etc.) from the example audio processor 116, the example clock 204, and/or any other component. In some examples, the example component interface 200 may receive the selected gain level resulting from an AGC protocol being performed by the example audio processor 116 with the amplifier 114. In some examples, such as when the AGC parameter determiner 118 is located at a server, the example component interface 200 is a wireless interface to wirelessly communicate data to/from the example meter 112.

The example AGC parameter controller 202 of FIG. 2 selects AGC parameters based on contextual information and the historical information stored in the example historical data storage 208 that corresponds to the contextual information. In some examples, the AGC parameter controller 202 may access the example historical data storage 208 to determine the past X number of gain levels selected by the audio processor 116 and generate a starting gain level for the upcoming AGC protocol based on the X number of gain levels. For example, if the AGC protocol starts at a high gain value and decreases until clipping ceases and the previous 5 selected gain values range from 35 dB to 10 dB, the AGC parameter controller 202 may select the initial gain level (e.g., 40 dB) to be some amount (e.g., 5 dB) more than the highest gain level of the last X selected gain levels (e.g., 40 dB=5 dB+35 dB). The amount may be based on user preferences, manufacturer preferences, and/or statistical analysis (e.g., one or more standard deviations above the highest value with respect to the last X selected gain levels). Additionally or alternatively, the example AGC parameter controller 202 selects and/or adjusts AGC parameters based on other historical data. Using the example of above, the AGC parameter controller 202 may select an initial gain level of 40 dB and may adjust the initial gain level based on other known characteristics. For example, if the AGC parameter controller 202 determines that the time of day corresponds to morning and a station currently being viewed is CNN, the AGC parameter controller 202 may access previous AGC parameters corresponding to morning and/or CNN. In such an example, if the selected gain levels from previous AGC protocols for morning and CNN have never been higher than 20 dB, the example AGC parameter controller 202 may adjust the initial gain level of 40 dB to some lower gain level corresponding to the 20 dB (e.g., based on an average, a weighted average, some value above the maximum 20 dB gain for morning and/or CNN, etc.). The amount of adjustment is based on user and/or manufacturer preferences. In some examples, the certain AGC parameters may be weighted more than other parameters in a weighted average. For example, panelist data may be weighted more than media type. In some examples, AGC parameters that have more data and/or more complex data stored in the example historical data storage 208 may be weighed more than parameters with less data and/or less complex data. For example, AGC parameters corresponding to (i) a time of day and (ii) a media type may way more than AGC parameters corresponding to only channel data.

The example clock 204 of FIG. 2 tracks time. The tracked time is transmitted to the example AGC parameter controller 202. In this manner, the AGC parameter controller 202 can use the time as part (e.g., corresponding to a time of day) of the contextual information used to generate the AGC parameters. In some examples, when the example component interface 200 obtains a selected gain level in response to the audio processor 116 preforming an AGC protocol, the example clock 204 generates a timestamp. In this manner, the example storage controller 206 can store the selected gain level in conjunction with the timestamp and/or a time of day/week/month/year corresponding to the timestamp.

The example storage controller 206 of FIG. 2 determines how to store historic data (e.g., selected gain levels from previous AGC protocols) in conjunction with known contextual data (e.g., panelist data, demographic data, time data, channel data, station data, location data, sound pressure level, etc.). For example, when the audio processor 116 of FIG. 1 performs an AGC protocol, the audio processor 116 transmits the selected gain level to the example storage controller 206 (e.g., via the example component interface 200). In some examples, the audio processor 116 and/or another component transmits known contextual data (e.g., separately or as part of the selected gain) at the time the AGC protocol was performed. For example, if the audio processor 116 and/or other components have identified one or more panelists (e.g., based on the panelists identifying themselves to the meter 112), demographics of the panelists, the type of media currently being output by the media output device 102 (e.g., sports, talk, movie, music, etc.), whether or not the media corresponds to a station identified as a favorite, location of the example meter 112, sound pressure level of the media, etc., the audio processor 116 and/or other components transmit such known contextual data to the example storage controller 206. In some examples, the storage controller 206 obtains a timestamp for the AGC protocol. The example storage controller 206 stores the selected gain level in conjunction with the contextual information and timestamp. For example, the storage controller 206 may store the selected gain level in conjunction with contextual information individually and/or in combination. For example, if the storage controller 206 receives a selected gain level of 55 dB in conjunction with a 25-35 year old male listening to talk radio at 7:30 AM on a Tuesday, the storage controller 206 may store the 55 dB in conjunction with 25-35 year old people, males, talk radio, morning, weekdays, and any combination of the contextual information (e.g., 25-35 males, weekday mornings, males listening to talk radio, 25-25 year old people listening to talk radio on a weekday, etc.) into the example historical data storage 208. In some examples, the storage controller 206 processes the timestamp to determine the time of day, week, month, and/or year to store the selected gain level in conjunction with a time period. In some examples, the storage controller 206 stores the last X selected gain levels at a location in the example historical data storage 208. When a new selected gain is obtained, the example storage controller 206 discards the oldest gain level from the location of the example historical data storage 208 and stores the new selected gain. In this manner, the example AGC parameter controller 202 can look to the location to determine AGC parameters based on the last X selected gain levels.

While an example manner of implementing the example meter 112 is illustrated in FIG. 1 and an example manner of implementing the example AGC parameter determiner 118 of FIG. 1 is illustrated in FIG. 2, one or more of the elements, processes and/or devices illustrated in FIG. 2 may be combined, divided, re-arranged, omitted, eliminated and/or implemented in any other way. Further, the example amplifier 114, the example audio processor, the example AGC parameter determiner 118, and/or, more generally, the example meter 112 of FIG. 1 and the example component interface 200, the example AGC parameter controller 202, the example clock 204, the example storage controller 206, the example historical data storage 208, and/or, more generally, the example AGC parameter determiner 118 of FIG. 2 may be implemented by hardware, software, firmware and/or any combination of hardware, software and/or firmware. Thus, for example, any of the example amplifier 114, the example audio processor, the example AGC parameter determiner 118, and/or, more generally, the example meter 112 of FIG. 1 and the example component interface 200, the example AGC parameter controller 202, the example clock 204, the example storage controller 206, the example historical data storage 208, and/or, more generally, the example AGC parameter determiner 118 of FIG. 2 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example amplifier 114, the example audio processor, the example AGC parameter determiner 118, and/or, more generally, the example meter 112 of FIG. 1 and the example component interface 200, the example AGC parameter controller 202, the example clock 204, the example storage controller 206, the example historical data storage 208, and/or, more generally, the example AGC parameter determiner 118 of FIG. 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example meter 112 of FIG. 1 and/or the example AGC parameter determiner 118 of FIG. 2 may include one or more elements, processes and/or devices in addition to, or instead of, those illustrated in FIGS. 1 and/or 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
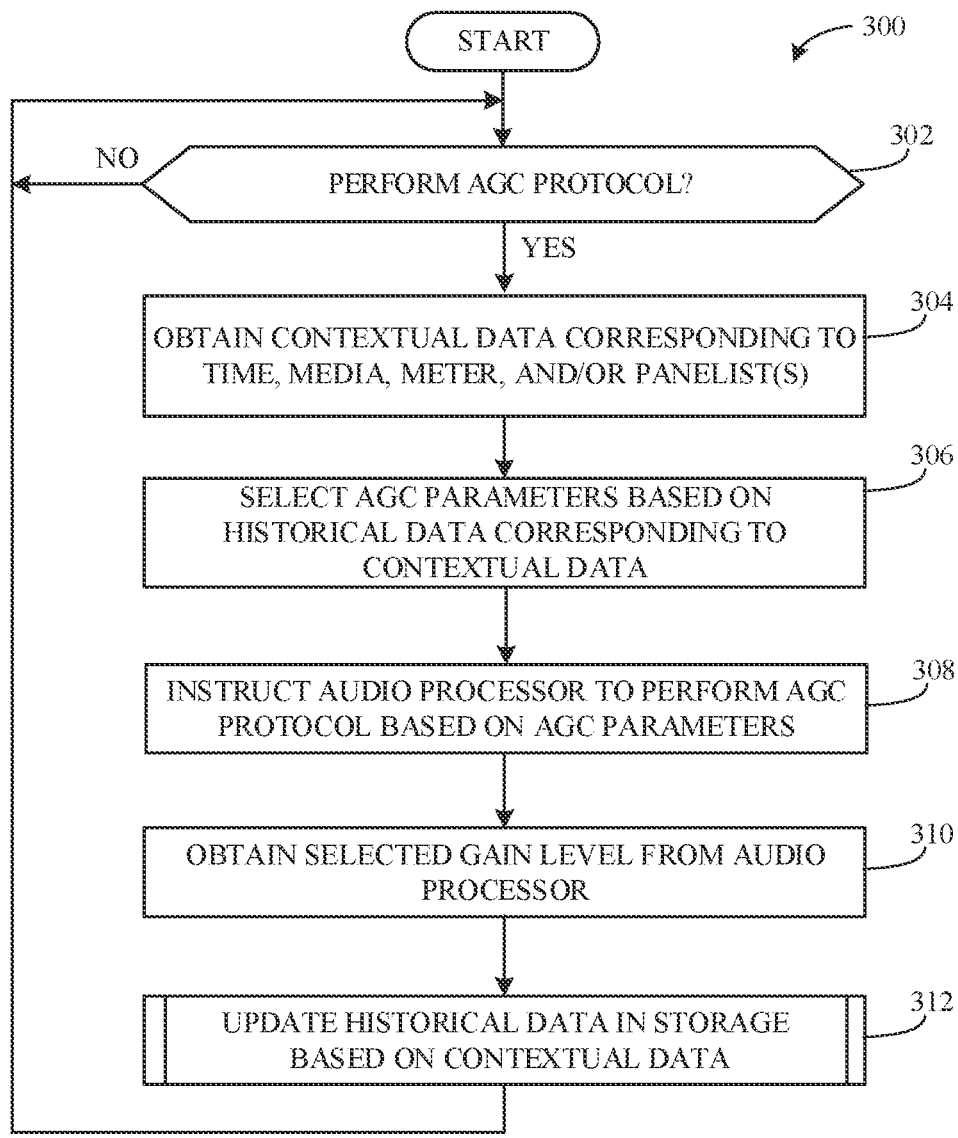
FIGS. 3-4 are flowcharts representative of example machine readable instructions that may be executed to implement the example AGC parameter determiner of FIGS. 1 and 2 to determine AGC parameter(s) for an AGC protocol.
Figure 4:
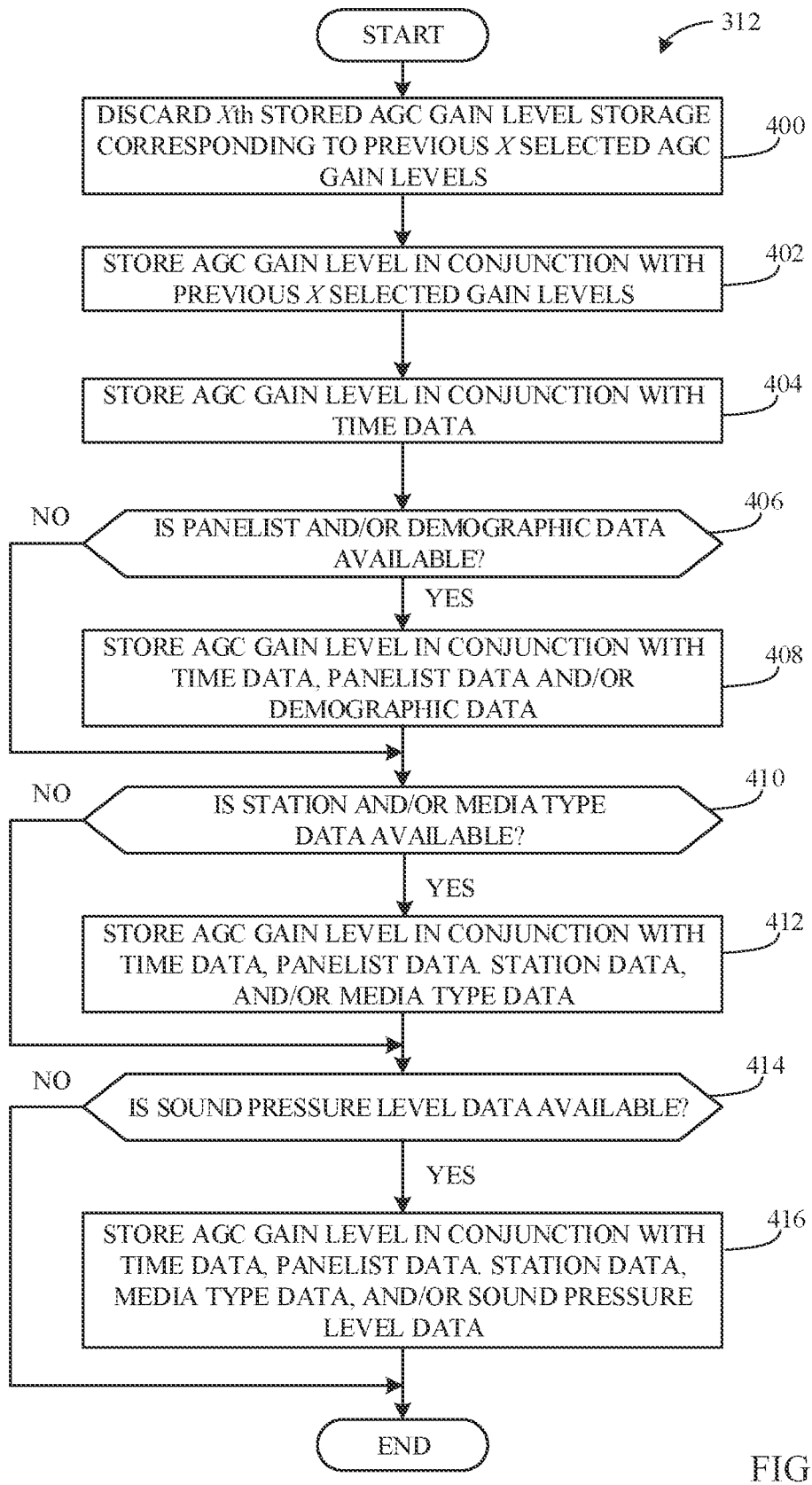

A flowchart representative of example hardware logic, machine readable instructions, hardware implemented state machines, and/or any combination thereof for implementing the example AGC parameter determiner 118 of FIG. 2 is shown in FIGS. 3-4. The machine readable instructions may be one or more executable programs or portion(s) of an executable program for execution by a computer processor such as the processor 512 shown in the example processor platform 500 discussed below in connection with FIG. 5. The program may be embodied in software stored on a non-transitory computer readable storage medium such as a CD-ROM, a floppy disk, a hard drive, a DVD, a Blu-ray disk, or a memory associated with the processor 512, but the entire program and/or parts thereof could alternatively be executed by a device other than the processor 512 and/or embodied in firmware or dedicated hardware. Further, although the example program is described with reference to the flowchart illustrated in FIGS. 3-4, many other methods of implementing the example AGC parameter determiner 118 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined from a set of executable instructions that implement a program such as that described herein. In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

As mentioned above, the example processes of FIGS. 3-4 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

FIG. 3 is an example flowchart 300 representative of example machine readable instructions that may be executed by the example AGC parameter determiner 118 of FIGS. 1 and 2 to select AGC parameters for an AGC protocol based on historical data. Although the instructions of FIG. 3 are described in conjunction with the example meter 112, microphone 110, media output device 102, and AGC parameter determiner 118 of FIGS. 1 and 2, the example instructions may be utilized by any type of meter, microphone, media output device, and/or AGC parameter determiner. Although the example flowchart 300 of FIG. 3 is described in conjunction with AGC gain levels, the flowchart 300 may be described in conjunction with other attributes, such as sound pressure algorithms.

At block 302, the example AGC parameter controller 202 determines if an AGC protocol is about to be performed. For example, the component interface 200 may receive a trigger from the example audio processor 116 and/or another component of the meter 112 or the AGC parameter controller 202 may determine that a predefined duration of time has passed to signify that an AGC protocol needs to be performed. If the example AGC parameter controller 202 determines that an AGC protocol is not to be performed (block 302: NO), control returns to block 302 until an AGC protocol is to be performed.

If the example AGC parameter controller 202 determines that an AGC protocol is to be performed (block 302: YES), the example AGC parameter controller 202 obtains contextual data (e.g., via the example component interface 200 and/or the example clock 204) corresponding to the time, the media, the meter and/or the panelists (block 304). As described above, the contextual data may be one or more identified panelists, demographics of the panelists, location of the meter, the type of media currently being output by the media output device 102 (e.g., sports, talk, movie, music, etc.), whether or not the media corresponds to a station identified as a favorite, sound pressure level of the media, a time of day/week/month/year, etc.

At block 306, the example AGC parameter controller 202 selects AGC parameters (e.g., a starting gain level and/or a range of gain levels to perform the AGC protocol) based on historical data corresponding to the corresponding contextual data and historical data. For example, if the contextual information identifies a particular panelist and the time identifies the evening and the AGC protocol only requires an initial gain value (e.g., the AGC protocol will start at an initial maximum gain level and reduce the gain until clipping ceases), the AGC parameter controller 202 will identify the highest selected gain in the historical data storage 208 that has been stored in conjunction with the panelist (e.g., 50 dB), evening (e.g., 60 dB), and/or the panelist and evening (e.g., 25 dB). Additionally, the historical data storage 208 may also identify the highest gain (or average of) of the past X selected gain levels (e.g., 15 dB). In such an example, the AGC parameter controller 202 may calculated a weighted average of the identified gain levels to select the AGC parameter for the AGC protocol. The weights may be based on use preferences, manufacturer preferences, and/or accuracy of the different ADC parameters (e.g., based on statistical analysis). Additionally or alternatively, the AGC parameter controller 202 may select the AGC parameters based on the last X selected gain levels from previous AGC protocols (e.g., using an average, a maximum value, a minimum value, a range, etc.). In some examples, the last X selected gain level (e.g., regardless of contextual data) from previous AGC protocols are included in the weighted average of the historical data corresponding to the contextual data. The last X selected gain levels are stored in the example historical data storage 208. Once the AGC parameter controller 202 calculates the gain level based on the weighted average, the AGC parameter controller 202 may add a buffer value to the gain value for added security.

At block 308, the example AGC parameter controller 202 instructs the example audio processor 116 to perform the AGC protocol based on the selected AGC parameters. Upon receiving the instructions, the audio processor 116 performs the AGC protocol using the selected AGC parameters to identify a gain level to utilize for the example amplifier 114 to generate signature and/or extract watermarks without clipping the audio signal. At block 310, the example storage controller 26 obtains (e.g., via the example component interface 200) the selected gain level from the audio processor 116. At block 312, the example storage controller 206 updates the AGC information in the example historical data storage 208 based on the obtained selected gain level and the contextual data, as further described below in conjunction with FIG. 4.

FIG. 4 is an example flowchart 312 representative of example machine readable instructions that may be executed by the example AGC parameter determiner 118 of FIGS. 1 and 2 update historical data in the example historical data storage 208 based on the obtained select gain level and the contextual data, as described above in conjunction with block 312 of FIG. 3. Although the instructions of FIG. 3 are described in conjunction with the example meter 112, microphone 110, media output device 102, and AGC parameter determiner 118 of FIGS. 1 and 2, the example instructions may be utilized by any type of meter, microphone, media output device, and/or AGC parameter determiner.

At block 400, the example storage controller 206 discards the Xth stored AGC gain level from the section of the example historical data storage 208 corresponding to the previous X selected AGC gain levels. As described above in conjunction with FIG. 2, the example historical data storage 208 has a section memory dedicated to the X gain levels selected in previous AGC protocols (e.g., the previous X AGC gain levels). Accordingly, when a new AGC level is selected, the oldest AGC gain level is discarded so that the section of memory corresponds to the X most recently selected AGC gain levels. At block 402, the example storage controller 206 stores (e.g., in the example historical data storage 208) the currently selected AGC gain level in conjunction with the previous X selected gain levels (e.g., in the above described section of memory in the example historical data storage 208).

At block 404, the example storage controller 206 stores the AGC gain level in conjunction with the time data in the example historical data storage 208. For example, the storage controller 206 may, based on the timestamp for the example clock 204, determine the time of day (e.g., morning, afternoon, evening, late night, etc.), time of week (e.g., weekend, weekday, Friday, etc.), and/or time of year (e.g., winter, spring, summer, fall) and store the example AGC gain level in conjunction with any one and/or any combination of the time of day, time of week, and/or time of year. For example, if an gain level selected by the AGC protocol is 30 dB and the timestamp corresponds to a weekend evening in the winter, the example storage controller 206 may store the example 50 dB selected gain in conjunction with weekend, evening, winter, weekend evenings, weekend in winter, evening in winter, and/or weekend evening in winter. In this manner, during a subsequent selection of AGC parameters, the example AGC parameter determiner 118 can select an AGC parameter based, in part, on the historical data corresponding to time of day, time of week, and/or time of year.

At block 406, the example storage controller 206 determines if there is panelist and/or demographic data available. The panelist and/or demographic data may be available when, for example, the meter 112 is registered and/or when a panelists signs into the meter 112 to self-identify. Other components of the example meter 112 track which panelists are currently signed in and/or the demographics of the audience members and/or panelists corresponding to the meter 112. Accordingly, the example storage controller 206 determines that panelist and/or demographic data is available when the component interface 200 receives the panelist and/or demographic data from other components of the example meter 112. If the example storage controller 206 determines that there is no panelist and/or demographic data available (block 406: NO), control continues to block 410. If the example storage controller 206 determines that there is panelist and/or demographic data available (block 406: YES), the example storage controller 206 stores the AGC gain level in conjunction with the time data, panelist data, and/or demographic data in the example historical data storage 208 (block 408). For example, if then panelist data corresponds to panelist "A" and the time data corresponds to weekday morning, the example storage controller 206 may store the selected AGC gain level in conjunction with the panelist "A," the panelist "A" in the morning, the panelist "A" during weekdays, and/or the panelist "A" during weekday mornings.

At block 410, the example storage controller 206 determines if there is station (e.g., channel, radio station, etc.) and/or media type data (e.g., sports, news, movie, podcast, music, particular episode, etc.) available. The panelist and/or demographic data may be available when, for example, the meter 112 has identified a station and/or media type based on an extracted watermark. Accordingly, the example storage controller 206 determines that station and/or media type data is available when the component interface 200 receives the station and/or media type data from the example audio processor 116 and/or other components of the example meter 112. If the example storage controller 206 determines that there is no station and/or media type data available (block 410: NO), control continues to block 414. If the example storage controller 206 determines that there is station and/or media type data available (block 410: YES), the example storage controller 206 stores the AGC gain level in conjunction with the time data, panelist data, demographic data, station data, and/or media type data in the example historical data storage 208 (block 412). For example, if then panelist data corresponds to panelist "A", the time data corresponds to evening, and the media type data corresponds to movie, the example storage controller 206 may store the selected AGC gain level in conjunction with the panelist "A," the panelist "A" in the evening, the panelist "A" while watching movies, and/or the panelist "A" during the evening while watching movies.

At block 414, the example storage controller 206 determines if there is sound pressure level data available. The sound pressure data may be available based on ambient audio measured by a microphone. For example, the microphone may obtain ambient audio and a processor may calculate the sound pressure data based on the ambient audio captured by the microphone. Accordingly, the example storage controller 206 determines that sound pressure data is available when the component interface 200 receives the sound pressure data from the other components of the example meter 112. If the example storage controller 206 determines that there is no sound pressure data available (block 414: NO), control returns to block 302 of FIG. 3. If the example storage controller 206 determines that there is station and/or media type data available (block 414: YES), the example storage controller 206 stores the AGC gain level in conjunction with the time data, panelist data, demographic data, station data, media type data, and/or sound pressure data in the example historical data storage 208 (block 416). For example, if then panelist data corresponds to panelist "A", the time data corresponds to winter, and the sound pressure data corresponds to 65 dB, the example storage controller 206 may store the selected AGC gain level in conjunction with the panelist "A," the panelist "A" in the winter, the panelist "A" while the sound pressure is 65 dB, and/or the panelist "A" during the winter while the sound pressure is 65 dB. After block 416, control returns to block 302 of FIG. 3. Although the example flowchart 312 describes updating historical data by storing the selected gain level in conjunction with time, panelist data, demographic data, station data, media type, and/or sound pressure level data, any available data (e.g., location of meter, media output device type, etc.) may be stored in the example historical data storage 208 in conjunction with the selected gain.

Figure 5:
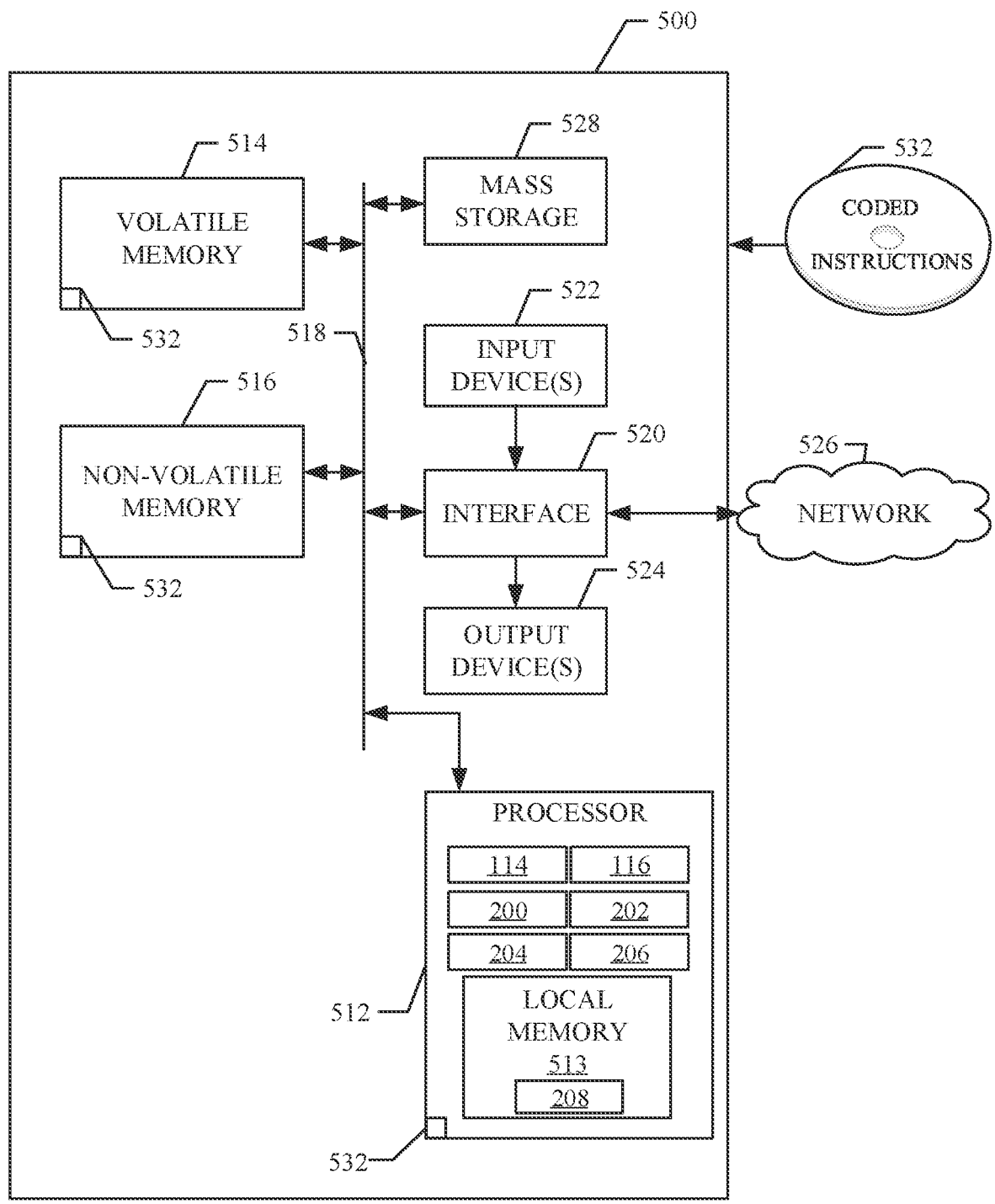
FIG. 5 is a block diagram of a processor platform structured to execute the example machine readable instructions of FIGS. 3-4 to control the example AGC parameter determiner of FIGS. 1 and 2.

FIG. 5 is a block diagram of an example processor platform 500 structured to execute the instructions of FIGS. 3-4 to implement the meter 112 of FIG. 1. The processor platform 500 can be, for example, a server, a personal computer, a mobile device (e.g., a cell phone, a smart phone, a tablet such as an iPad™), a personal digital assistant (PDA), an Internet appliance, a gaming console, a personal video recorder, a set top box, an audio meter, a personal people meter, a headset or other wearable device, or any other type of computing device.

The processor platform 500 of the illustrated example includes a processor 512. The processor 512 of the illustrated example is hardware. For example, the processor 512 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example amplifier 114, the example audio processor 116, the example component interface 200, the example AGC parameter controller 202, the example clock 204, and/or the example storage controller 206.

The processor 512 of the illustrated example includes a local memory 513 (e.g., a cache). The processor 512 of the illustrated example is in communication with a main memory including a volatile memory 514 and a non-volatile memory 516 via a bus 518. The volatile memory 514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 516 may be implemented by flash memory and/or any other desired type of memory device. Access to the main memory 514, 516 is controlled by a memory controller. Although the example historical data storage 208 is implemented in the example local memory 513, the example historical data storage 208 may be implemented by the example volatile memory 514 and/or non-volatile memory 516.

The processor platform 500 of the illustrated example also includes an interface circuit 520. The interface circuit 520 may be implemented by any type of interface standard, such as an Ethernet interface, a universal serial bus (USB), a Bluetooth® interface, a near field communication (NFC) interface, and/or a PCI express interface.

In the illustrated example, one or more input devices 522 are connected to the interface circuit 520. The input device(s) 522 permit(s) a user to enter data and/or commands into the processor 512. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 524 are also connected to the interface circuit 520 of the illustrated example. The output devices 524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 520 of the illustrated example, thus, typically includes a graphics driver card, a graphics driver chip and/or a graphics driver processor.

The interface circuit 520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 500 of the illustrated example also includes one or more mass storage devices 528 for storing software and/or data. Examples of such mass storage devices 528 include floppy disk drives, hard drive disks, compact disk drives, Blu-ray disk drives, redundant array of independent disks (RAID) systems, and digital versatile disk (DVD) drives.

The machine executable instructions 532 of FIGS. 3-4 may be stored in the mass storage device 528, in the volatile memory 514, in the non-volatile memory 516, and/or on a removable non-transitory computer readable storage medium such as a CD or DVD.

From the foregoing, it will be appreciated that example methods, apparatus and articles of manufacture have been disclosed that perform an automated gain control protocol with an amplifier based on historical data corresponding to contextual data. The disclosed methods, apparatus and articles of manufacture improve the efficiency of using a computing device by decreasing the total number of gain levels needed during an AGC protocol to determine the optimal gain level. For example, instead of performing an AGC protocol that starts at the highest gain of an amplifier, historical data can set the starting gain level and/or range of gain value for the AGC protocol to result in a reduction of time and resources for the AGC protocol. The disclosed methods, apparatus and articles of manufacture are accordingly directed to one or more improvement(s) in the functioning of a computer.

Although certain example methods, apparatus and articles of manufacture have been described herein, other implementations are possible. The scope of coverage of this patent is not limited thereto. On the contrary, this patent covers all methods, apparatus and articles of manufacture fairly falling within the scope of the claims of this patent.

What is claimed is:

1. An apparatus comprising:
    at least one memory;
    computer readable instructions; and
    at least one processor to execute the instructions to at least:
        select an automatic gain control (AGC) parameter for an AGC protocol based on historical data corresponding to contextual data, the contextual data including at least one of a time during which the AGC protocol is performed, a panelist identified by a meter, demographics of an audience identified by the meter, a location of the meter, a station identified by the meter, a media type identified by the meter, or a sound pressure level identified by the meter; and
        perform the AGC protocol based on the selected AGC parameter.

2. The apparatus of claim 1, wherein the at least one memory is to store the historical data.

3. The apparatus of claim 2, wherein the at least one processor is to update the historical data based on the contextual data and a result of the AGC protocol.

4. The apparatus of claim 1, wherein the historical data includes gain levels from previous AGC protocols.

5. The apparatus of claim 1, wherein the AGC parameter is at least one of an initial gain level of the AGC protocol or a range of gain levels to apply in the AGC protocol.

6. The apparatus of claim 1, wherein to perform the AGC protocol, the at least one processor is to:
    initialize an adjustable gain level of the AGC protocol to an initial gain level corresponding to the selected AGC parameter;
    adjust the adjustable gain level of the AGC protocol based on the selected AGC parameter; and
    after the adjustment of the adjustable gain level, select a resulting gain level of the adjustable gain level to be the result of the AGC protocol.

7. The apparatus of claim 1, wherein the at least one processor is to select the AGC parameter for the AGC protocol by:
    obtaining the contextual data from the meter;
    identifying one or more prior gain levels included in a portion of the historical data stored in conjunction with at least a portion of the contextual data; and
    determining the AGC parameter based on the one or more prior gain levels.

8. The apparatus of claim 7, wherein the one or more prior gain levels include a plurality of prior gain levels, and the at least one processor is to determine the AGC parameter based on a weighted average of the plurality of prior gain levels.

9. The apparatus of claim 1, wherein the historical data is stored in conjunction with prior contextual data.

10. At least one non-transitory computer readable medium comprising instructions which, when executed, cause one or more processors to at least:
    select an automatic gain control (AGC) parameter for an AGC protocol based on historical data corresponding to contextual data, the contextual data including at least one of a time during which the AGC protocol is performed, a panelist identified by a meter, demographics of an audience identified by the meter, a location of the meter, a station identified by the meter, a media type identified by the meter, or a sound pressure level identified by the meter; and
    perform the AGC protocol based on the selected AGC parameter.

11. The at least one non-transitory computer readable medium of claim 10, wherein the instructions cause the one or more processors to store the historical data.

12. The at least one non-transitory computer readable medium of claim 11, wherein the instructions cause the one or more processors to update the historical data based on the contextual data and a result of the AGC protocol.

13. The at least one non-transitory computer readable medium of claim 10, wherein the historical data includes gain levels from previous AGC protocols.

14. The at least one non-transitory computer readable medium of claim 10, wherein the AGC parameter is at least one of an initial gain level of the AGC protocol or a range of gain levels to apply in the AGC protocol.

15. The at least one non-transitory computer readable medium of claim 10, wherein the instructions cause the one or more processors to perform the AGC protocol by:
    initializing an adjustable gain level of the AGC protocol to an initial gain level corresponding to the selected AGC parameter;
    adjusting the adjustable gain level of the AGC protocol based on the selected AGC parameter; and
    after the adjustment of the adjustable gain level, selecting a resulting gain level of the adjustable gain level to be the result of the AGC protocol.

16. The at least one non-transitory computer readable medium of claim 10, wherein the instructions cause the one or more processors to select the AGC parameter for the AGC protocol by:
    obtaining the contextual data from the meter;
    identifying one or more prior gain levels included in a portion of the historical data stored in conjunction with at least a portion of the contextual data; and
    determining the AGC parameter based on the one or more prior gain levels.

17. The at least one non-transitory computer readable medium of claim 16, wherein the one or more prior gain levels include a plurality of prior gain levels, and the instructions cause the one or more processors to determine the AGC parameter based on a weighted average of the plurality of prior gain levels.

18. The at least one non-transitory computer readable medium of claim 10, wherein the instructions cause the one or more processors to store the historical data in conjunction with prior contextual data.

19. An apparatus comprising:
    means for selecting an automatic gain control (AGC) parameter for an AGC protocol based on historical data corresponding to contextual data, the contextual data including at least one of a time during which the AGC protocol is performed, a panelist identified by a meter, demographics of an audience identified by the meter, a location of the meter, a station identified by the meter, a media type identified by the meter, or a sound pressure level identified by the meter; and
    means for performing the AGC protocol based on the selected AGC parameter.

20. The apparatus of claim 19, further including means for storing the historical data.

21. The apparatus of claim 20, further including means for updating the historical data based on the contextual data and a result of the AGC protocol.

22. The apparatus of claim 19, wherein the historical data includes gain levels from previous AGC protocols.

23. The apparatus of claim 19, wherein the AGC parameter is at least one of an initial gain level of the AGC protocol or a range of gain levels to apply in the AGC protocol.

24. The apparatus of claim 19, wherein to perform the AGC protocol, the means for performing is to:
   initialize an adjustable gain level of the AGC protocol to an initial gain level corresponding to the selected AGC parameter;
   adjust the adjustable gain level of the AGC protocol based on the selected AGC parameter; and
   after the adjustment of the adjustable gain level, select a resulting gain level of the adjustable gain level to be the result of the AGC protocol.

25. The apparatus of claim 19, wherein the means for selecting is to select the AGC parameter for the AGC protocol by:
   obtaining the contextual data from the meter;
   identifying one or more prior gain levels included in a portion of the historical data stored in conjunction with at least a portion of the contextual data; and
   determining the AGC parameter based on the one or more prior gain levels.

26. The apparatus of claim 25, wherein the one or more prior gain levels include a plurality of prior gain levels, and the means for selecting is to determine the AGC parameter based on a weighted average of the plurality of prior gain levels.

27. The apparatus of claim 19, wherein the historical data is stored in conjunction with prior contextual data.

* * * * *